United States Patent
Khoo et al.

(10) Patent No.: US 7,373,618 B1
(45) Date of Patent: May 13, 2008

(54) METHOD AND SYSTEM FOR SELECTION AND REPLACEMENT OF SUBCIRCUITS IN EQUIVALENCE CHECKING

(75) Inventors: Kei-Yong Khoo, San Jose, CA (US); Tao Feng, Santa Clara, CA (US); Debjyoti Paul, Santa Clara, CA (US); Chih-Chang Lin, Saratoga, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 221 days.

(21) Appl. No.: 11/271,269

(22) Filed: Nov. 10, 2005

Related U.S. Application Data

(60) Provisional application No. 60/627,208, filed on Nov. 12, 2004.

(51) Int. Cl.
*G06F 17/50* (2006.01)
(52) U.S. Cl. .................... 716/3; 716/2; 716/4
(58) Field of Classification Search ............ 716/3, 716/2, 4
See application file for complete search history.

(56) References Cited

U.S. PATENT DOCUMENTS

| | | | |
|---|---|---|---|
| 5,519,627 A | 5/1996 | Mahmood et al. | |
| 5,764,525 A * | 6/1998 | Mahmood et al. | 716/18 |
| 5,841,663 A | 11/1998 | Sharma et al. | |
| 6,148,436 A | 11/2000 | Wohl | |
| 6,163,876 A | 12/2000 | Ashar et al. | |
| 6,336,206 B1 | 1/2002 | Lockyear | |
| 6,378,112 B1 | 4/2002 | Martin et al. | |
| 6,457,173 B1 * | 9/2002 | Gupta et al. | 717/149 |
| 6,490,717 B1 | 12/2002 | Pedersen et al. | |
| 6,530,073 B2 | 3/2003 | Morgan | |
| 6,598,215 B2 * | 7/2003 | Das et al. | 716/12 |
| 6,611,947 B1 | 8/2003 | Higgins et al. | |
| 6,738,392 B1 * | 5/2004 | Thurston | 370/503 |
| 6,742,174 B1 | 5/2004 | Chen et al. | |
| 6,999,910 B2 * | 2/2006 | Koford et al. | 703/13 |

OTHER PUBLICATIONS

Brand, D. "Verification of Large Synthesized Designs" Proceedings of the 1993 IEEE/ACM International Conference on Computer-Aided Design (ICCAD-93), Digest of Technical Papers, Santa Clara, California, Nov. 7-11, 1993, pp. 534-537.

Burch, J.R. et al. "Symbolic Model Checking for Sequential Circuit Verification" IEEE Transactions on Computer-Aided Design of Integrated Circuits and Systems, Apr. 1994, vol. 13, No. 4, pp. 401-424.

(Continued)

*Primary Examiner*—Sun James Lin
(74) *Attorney, Agent, or Firm*—Bingham McCutchen LLP

(57) ABSTRACT

A system, method, computer program, and article of manufacture for generating a golden circuit including datapath components for equivalence checking of synthesized revised circuit. The method includes generating a set of static, dynamic and derived candidates for the datapath component subcircuit, evaluating the similarity degree for each candidate in relation to the revised circuits and selecting one candidate for implementation in the golden circuit. As a result, the subcircuit of datapath component in the golden circuit is replaced with the subcircuit which is more similar to the revised circuit to improve the efficiency of the equivalence checking.

33 Claims, 4 Drawing Sheets

OTHER PUBLICATIONS

Kuehlmann, A. et al. "Equivalence Checking Using Cuts and Heaps" Proceedings of the 34th Annual ACM/IEEE Design Automation Conference (DAC 97), Anaheim, California, Jun. 9-13, 1997, pp. 263-268.

Pawlovsky, A.P. et al. "Verification of Register Transfer Level (RTL) Designs" Proceedings of the Pacific Rim International Symposium on Fault Tolerant Systems (PRFTS '91), Kawasaki, Japan, Sep. 26-27, 1991, pp. 30-35.

Stoffel, D. et al. "Logic Equivalence Checking by Optimization Techniques" Proceedings of the International Workshop on CAD, Test and Evaluation of Dependability; Beijing, China, Jul. 2-3, 1996, pp. 85-90.

Vakilotojar, V. et al. "RTL Verification of Timed Asynchronous and Heterogeneous Systems Using Symbolic Model Checking" Proceedings of the ASP-DAC '97: Asia and South Pacific Design Automation Conference, Chiba City, Japan, Jan. 28-31, 1997, pp. 181-188.

U.S. Appl. No. 11/444,971, filed May 31, 2006.

* cited by examiner

METHOD AND SYSTEM FOR SELECTION AND REPLACEMENT OF SUBCIRCUITS IN EQUIVALENCE CHECKING

CROSS-REFERENCE TO RELATED APPLICATIONS

The present application claims the benefit of U.S. Provisional Application Ser. No. 60/627,208, filed on Nov. 12, 2004, the content of which is hereby incorporated by reference in its entirety.

BACKGROUND AND SUMMARY

The invention is generally directed to the area of verification for IC designs. In particular, some embodiments of the invention are related to an improved approach for implementing equivalence checking functionality in EDA verification tools.

Today's integrated circuits (ICs) typically contain large numbers of circuit elements. Computer-aided design (CAD) and computer-aided engineering (CAE) tools are essential in assisting circuit designers to produce these complicated ICs. Circuit designs are typically represented in a user-specified hardware description language (HDL), which demonstrate the behavioral properties of the circuit.

Designers commonly utilize CAE software, or synthesis, to translate the behavioral representation, for example, a Register-Transfer-Level (RTL) description, into an implementation representation, for example, a gate-level representation. The synthesizer chooses the implementation architecture based on parameters such as timing, footprint, and power consumption. The result of the synthesis process, the gate-level representation, is referred to as the revised circuit, while the behavioral property of the circuit, the RTL representation, is referred to as the golden circuit. The possibility of errors in creating an implementation architecture from a golden circuit is high as the process is complex.

With increasing design complexity, formal verification becomes integral in the design process to ensure that the revised circuit is equivalent to the original specification, or golden circuit. In the verification of digital circuits, signals in the circuits are "compared" in some manner in order to draw a conclusion on the "correctness" of one or more properties of the circuits. For example, to determine if two circuits with identical state encoding will behave identically under some excitations, the simulated values of the corresponding state-points in the two circuits are compared when the circuits are subjected to the same excitations.

Alternatively, to show that the two circuits will behave identically under all possible excitations, a formal methodology is used wherein the functions of the corresponding state-points in the two circuits are proved to be functionally equivalent. This method is known as formal equivalence checking and it is in the category of verification methods known as formal verification:

More specifically, during equivalence checking, an implementation architecture is created for the golden circuit and is compared to a possibly synthesized revised implementation circuit to determine if they are equivalent. However, the implementation architecture in the golden circuit is not limited by considerations of power consumption, footprint, or timing, and thus, can, and often does, choose a different architecture. The likelihood of different architectures being chosen increases when datapath components are used.

Datapath components are sub-circuits which implement arithmetic operations like multiplication, addition, squaring, shifting and division. Typically these components operate on more than one bit of data at a time. Other examples include the adder tree or partial product generator in the multiplier.

There are a great number of ways to implement a datapath component while maintaining the same functionality. There are well defined methods of implementing the datapath component at bit level to achieve specific goals like power, timing, area, placement etc. Such methods generate architectures of the datapath component. Common examples of architectures for a multiplier summation tree include ripple carry, carry save and Wallace tree. Similar architectures exist for adder, subtractors, dividers, shifters.

As such, when a datapath component exists in the golden design, the revised design may have very different architecture than the implementation version of the golden design created during equivalence checking. If the architecture generated for golden design is dramatically different from the revised architecture, then excessive system resources/runtime may be needed to perform equivalence checking of the two designs. If the architecture generated from the RTL for equivalence checking is very close to the revised gate-level implementation, then system resources/runtime that is needed to perform equivalence checking of the two designs will be minimized.

A solution is needed for equivalence checking to automatically create an implementation architecture of an RTL model that is similar to the revised gate-level implementation as possible, without relying on any external auxiliary files which annotate the revised circuit information.

A method of subcircuit architecture selection and replacement is defined in the purpose to re-generate the golden circuit which is more similar in relation to the revised circuit. The method includes creating the candidates, evaluating the candidates, selecting the best candidate, and replacing the subcircuit with the selected candidate.

DETAILED DESCRIPTION OF INVENTION

According to some embodiments, the synthesis tool generates the revised circuit from the behavioral description of the circuit, or the RTL description, to achieve the logic optimization objectives. To verify that the revised circuit implements the same function as the RTL description, an equivalence checking tool generates a golden circuit by simply parsing the RTL description without logic optimizations. The outputs of golden and revised circuit are compared by the equivalence checking tool. Due to the complexity of circuit designs and the numerous methods for logic optimization, the revised circuit can be structured differently from the golden circuit. The greater the dissimilarity between the golden and revised circuit, the greater the consumption of resources during equivalence checking. This disclosure provides a method to ensure the similarity between the golden and revised circuits to minimize the required resources.

Figure 2:
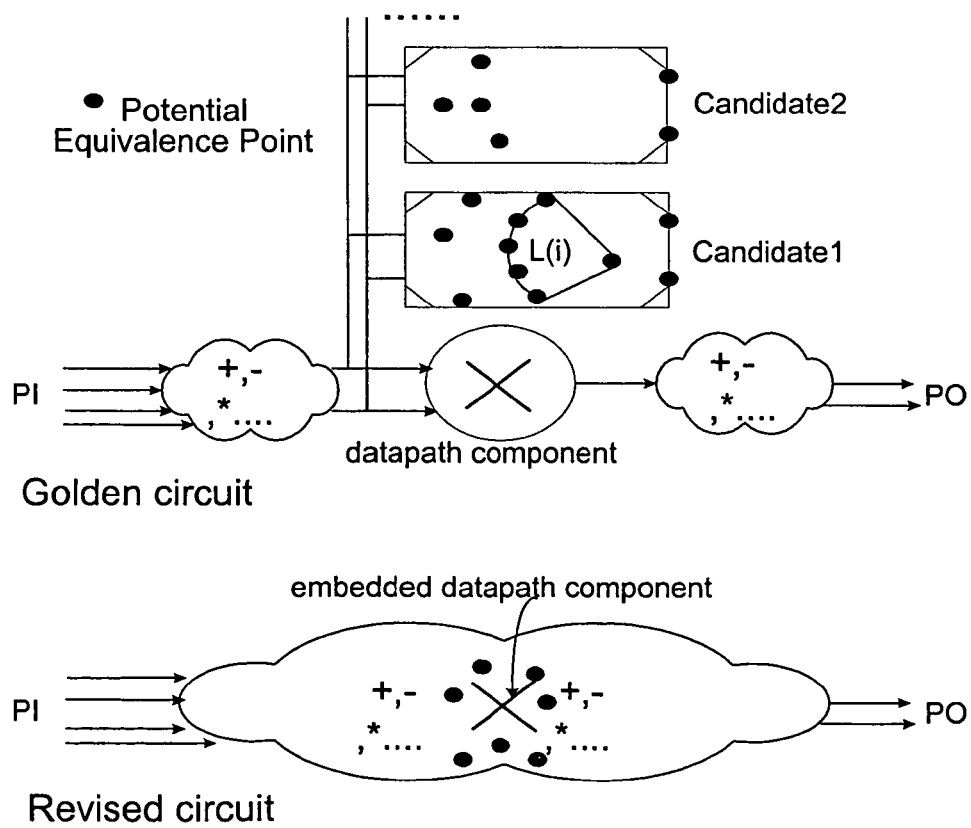
FIG. 2 is an example of the subcircuit in the golden and revised circuit.

In one embodiment shown in FIG. 2, the RTL description contains several datapath components including a multiplier. The equivalence checking tool generates the golden circuit with clear boundary for each datapath component. The subcircuit of datapath component can be easily extracted in the golden circuit. On the other hand, the synthesis tool generates the revised circuit with logic optimizations. The synthesis tool chooses one of many different ways to implement the datapath subcircuit and may also merge the subcircuit boundary with other surrounding logics. Thus the corresponding datapath components can be indistinguishably embedded in the revised netlist without identifiable inputs and outputs boundaries. To generate a golden circuit that is more similar as the revised circuit for equivalence checking, multiple candidates of a subcircuit are generated and connected into the golden circuit. Each candidate is a subcircuit implementing the same function with a different structure. The candidate which serves best for equivalence checking is selected and replaced in the golden circuit.

Figure 1:
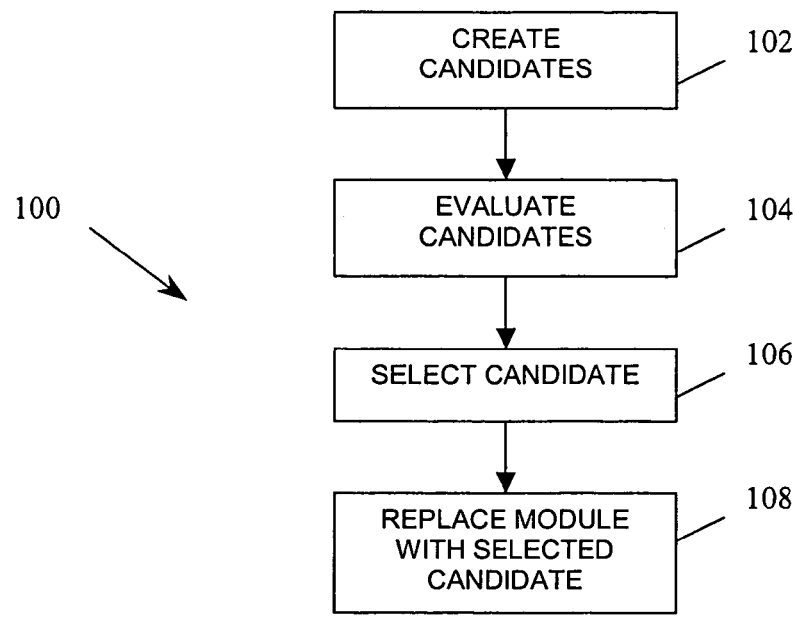
FIG. 1 is a representation of process 100, an overview of the subcircuit selection and replacement process.

An embodiment of the subcircuit selection and replacement process, overview process 100, is shown in FIG. 1. One or more candidates are created in process action 102. The set of candidates are evaluated in process action 104. One candidate is selected in process action 106. The selected candidate replaces a subcircuit in the golden circuit in process action 108. Each of these actions is described in further detail below.

In one embodiment, there are two types of candidates, static candidates and dynamic candidates. Static candidates come from a limited set of pre-defined implementations in the static templates. The static templates include commonly used architectures in the modern VLSI design (for example, as described in Behrooz. Parhami, "Computer Arithmetic: Algorithms and Hardware Designs," Oxford University Press, which is hereby incorporated by reference in its entirety). For example of the multiplier operator, it can be implemented with different architectures in bit-level, such as Booth or non-Booth encoder for partial product generator, ripple-carry adder or carry-save adder for summation tree. A multiplier can also be implemented with different architectures in word-level. For example, a multiplier in FPGA device can be implemented by adding the result of several smaller fixed-size multipliers, as described in Jean-Luc Beuchat and Arnaud Tisserand, "Proceeding of $12^{th}$ International Conference on Field-Programmable Logic and Applications", pp. 513-522, September, 2002, which is hereby incorporated by reference in its entirety. A signed multiplier can be implemented by using an unsigned multiplier with the circuitry for sign bit extension. Due to the commutative property, a multiplier can be implemented differently by swapping the input operands. The static templates are generated from various pre-defined algorithms for datapath components. The static candidate generation is independent from the implementation of the revised circuit. The static candidates can be as many as possible to match the architecture of the datapath component implemented in the revised circuit.

Figure 3:
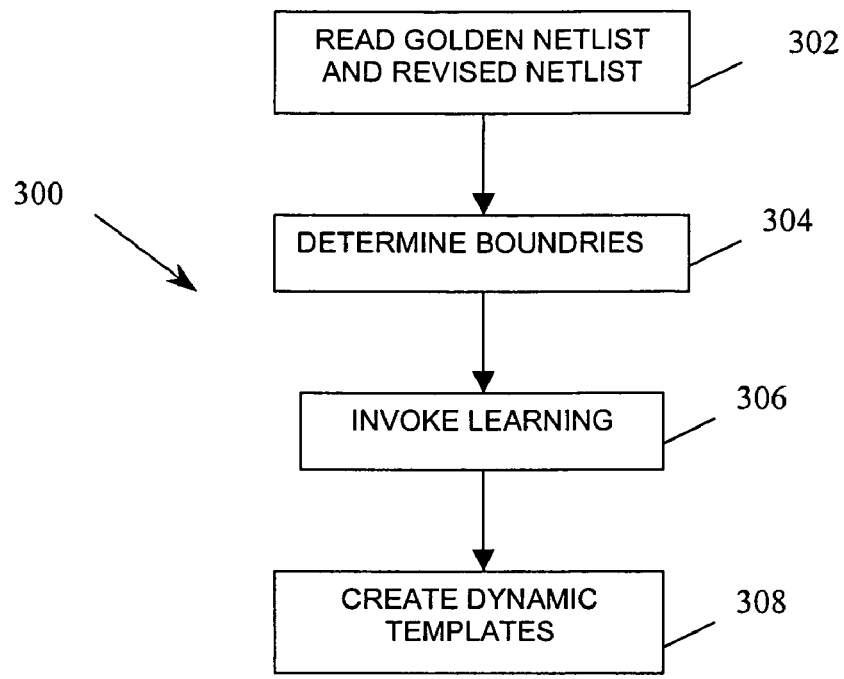
FIG. 3 is a representation of process 300, the dynamic candidate creation process.

Dynamic candidates come from dynamic templates. A dynamic template is a template that is not available as part of a pre-defined implementation, but is created via a re-structure learning process. Dynamic templates can be created if the available static templates are not similar to the revised implementation. The dynamic template creation process, process 300, is shown in FIG. 3. Process action 302 reads in the golden netlist and the revised netlist. Process action 304 determines the boundaries of subcircuits in the two netlists. If the boundary of a subcircuit in the revised circuit can be found, process action 306 invokes learning of the subcircuit. From this learning process, dynamic templates are created in process action 308. Further information regarding the dynamic template creation process can be found in related U.S. Pat. No. 6,742,174, which is incorporated by reference in its entirety as if fully set forth herein.

The dynamic template created for one subcircuit can be used to generate a candidate for another subcircuit if they are the same datapath components. In one embodiment, the dynamic template for one subcircuit is duplicated as the candidate for another subcircuit.

Figure 4:
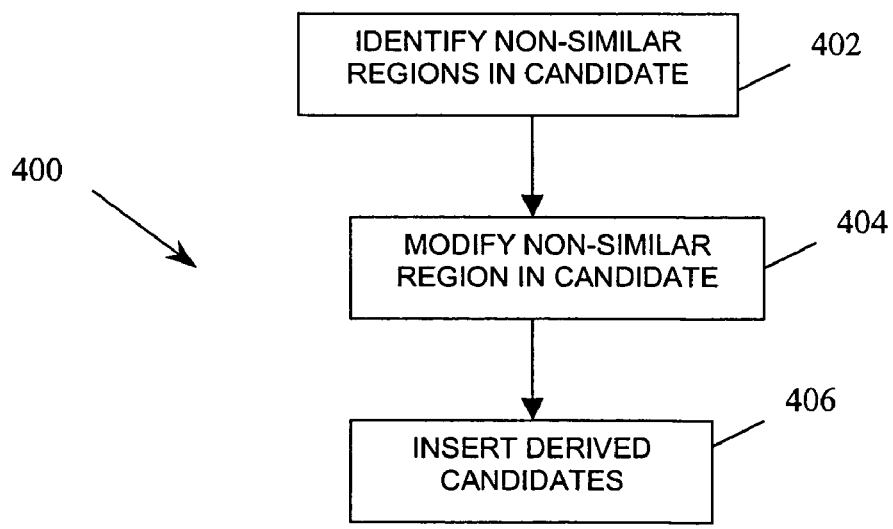
FIG. 4 is a representation of process 400, the derived candidate creation process.

The dynamic template can also be derived from an existing candidate. An embodiment of a process 400 for the creation of derived candidates is shown in FIG. 4. The non-similar portion of the candidate is identified in process action 402. The non-similar portions of the candidate are modified in process action 404. These modifications preserve the behavioral functionality, while creating additional candidate architectures. In different embodiments, the modification is applied based on the different optimization objectives. It includes the timing based synthesis, area based synthesis and low power based synthesis. For example, for the adder tree subcircuit, the order of full adders is permutated to change the structure of the subcircuit while keeping its output function unchanged. Each synthesis technique yields a different derived candidate. In another embodiment, these candidates that only differ from each other by a small amount, are referred to as clusters, or derived clusters. The resulting collection of derived candidates, or the cluster of derived candidates, is inserted in process action 406.

It is noted there does not need to be order dependency between the creation of static templates and dynamic templates. One could create static templates followed by dynamic templates, or vice versa. In some embodiments, one could use either static templates or dynamic templates, e.g., if one is not available.

Figure 5:
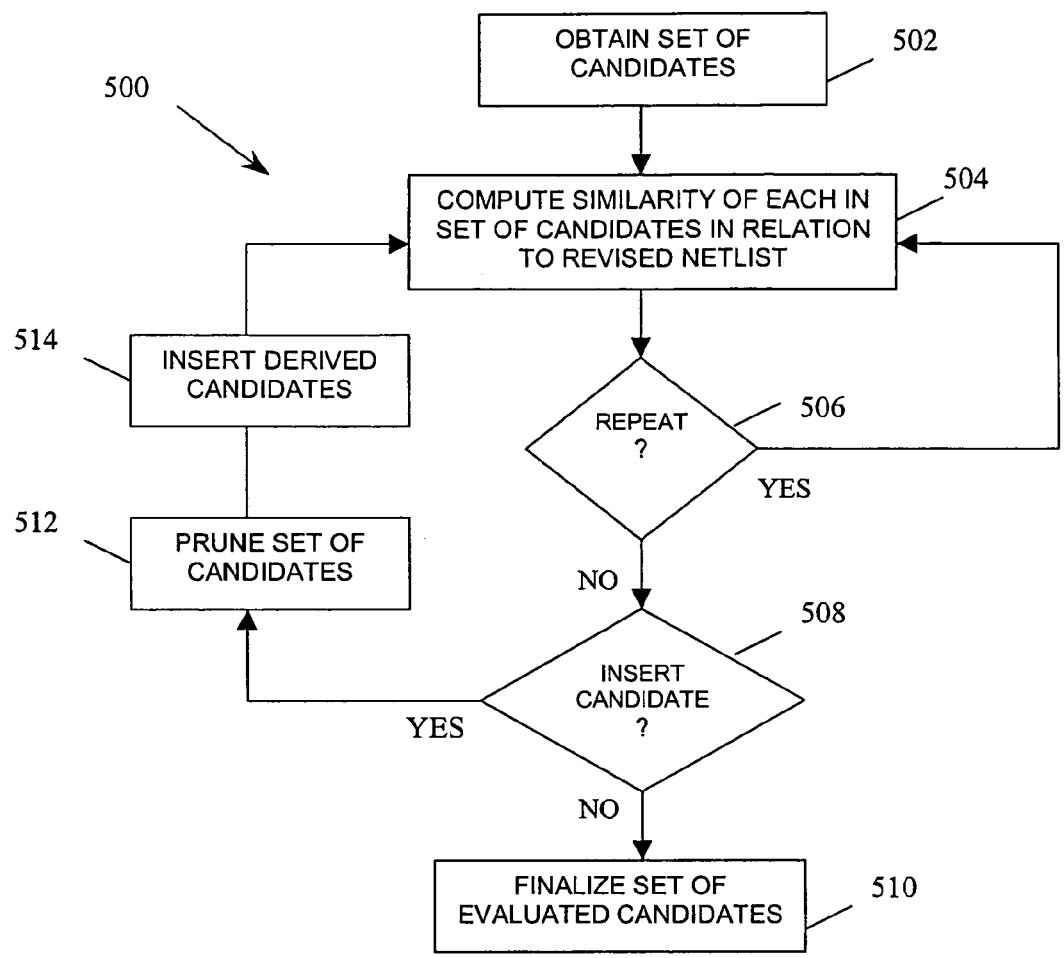
FIG. 5 is a representation of process 500, the similarity evaluation and candidate refinement process.

The group of static and dynamic candidates is evaluated to find the one which is most similar to the revised architecture in process 500, shown in FIG. 5. The set of candidates is obtained in process action 502. Process action 504 computes the local similarity of each candidate subcircuit in relation to the revised circuit.

Generally, the similarity degree for a candidate subcircuit in relation to the revised circuit should reflect the complexity of comparison in equivalence checking if this subcircuit is selected and replaced in the golden circuit. As shown in FIG. 2, in one embodiment, to compute similarity, the subcircuit boundary is known in the golden circuit and the created candidates are all connected with the input boundary.

To determine the similarity degree for a candidate, boolean simulation is applied to the entire golden and revised circuits based on the same primary input assignments. For each simulation run, if a wire in a revised circuit repeatedly has the equivalence or inverted-equivalence simulation result as a wire in the golden circuit, the wire in the golden netlist is noted as a potential equivalence point. The potential equivalence points can be used to calculate the similarity degree.

The similarity degree for a candidate in relation to the revised netlist can be measured by several factors. The ratio of potential equivalence points over all the wires in a candidate subcircuit is one factor to determine the similarity degree.

Another factor of similarity degree is the distribution of potential equivalence points in the candidate. If the percentage of potential equivalence points in the candidates cannot distinguish one candidate from the rest, the distribution is another deciding criterion to select the one which is expected to be easier to compare with the revised circuit. In one embodiment, the candidate whose potential equivalence points are evenly distributed in the subcircuit will be chosen. Consider another candidate that has the same percentage of potential equivalence points but the equivalence points are mainly congested in a region of the subcircuit, it is usually more difficult to compare with the revised circuit.

To consider the distribution of potential equivalence points in the similarity evaluation, each potential equivalence point i has a value L(i) to represent its distance to the nearest potential equivalence points in its fan-in logic cones. As shown in FIG. 2, L(i) is the total number of gates in the logic cones when traversing the fan-in gates from the potential equivalence point i until it reaches another potential equivalence points. The potential equivalence points also include all the outputs of candidate subcircuit. The similarity criterion is generated by normalizing the L(i) for all the potential equivalence points in the candidate subcircuit $$\left( \left[ \sum_{i=0}^{m-1} \frac{(L(i))^N}{m} \right]^{\frac{1}{N}} \right),$$

where m is the total number of potential equivalence points in the candidate subcircuit and N is the normalization parameter. In one embodiment, N is set to 2 and the normalization becomes root-mean-square. For the normalized result, a larger number indicates a lower similarity degree in comparison because in average it represents that the potential equivalence point is located in a longer distance from the others in the candidate sub circuit.

The third factor of similarity degree focuses on particular potential equivalence points such as the outputs of full adders in the candidate subcircuit. These points are more heavily weighted during the calculation of similarity degree because they usually serve as good cutpoints in comparison. Based on these cutpoints, the structural hashing in the golden and revised circuit can be applied to analyze the circuit structural similarity as the fourth factor.

The calculated similarity degree has several features. First, it is a combination of several factors to predict the comparison performance as accurately as possible. Second, it focuses on each individual subcircuit instead of the whole circuit, which makes the similarity degree more sensitive to the minor changes in the local region. Third, the calculation does not require all the wires in the boundary of a golden subcircuit to have potential equivalence points in the revised circuit. Therefore, the corresponding component can be seamlessly embedded in the revised circuit without the need to locate its boundaries. This makes the process of similarity evaluation more robust.

In process 500, process action 506 decides whether further evaluation of similarity degree is required. Each iteration of evaluation improves the accuracy of the similarity calculation. For example, more boolean simulation runs are invoked to get more accurate potential equivalence points for each candidate, or other factors such as distribution of potential equivalence points are considered in the similarity calculation. The evaluation process can be repeated many times to obtain an accurate result. If further evaluation is required, process 506 flows to process action 504. In one embodiment, this decision can be based on the number of candidates which show good local similarity. If there are multiple candidates in the set which show good similarity, further evaluation is needed to determine which one of these is a better replacement. In some embodiments, a maximum limit on the number of iterations is used to ensure convergence of this process. If it is determined that no further evaluation is required, process 506 flows to process action 508.

In process action 508, a decision is made whether a satisfactory candidate has been found for replacement or if more candidates need to be created in the process for evaluation. In one embodiment this decision can be made on the basis of the similarity degree number. If at least one candidate has a similarity number above a fixed threshold, it is accepted as a satisfactory finalized candidate. If one or more satisfactory candidates are found, process action 508 flows to process action 510 where the set of candidates is finalized, else it flows to process action 512. A maximum limit of iterations is enforced in process action 508 to ensure convergence.

In process action 512, certain candidates are pruned from the set. In some embodiments, the candidates in the set that have similarity degree number below a threshold value are pruned from the set. Process action 512 flows to process action 514 which creates and inserts additional candidates. Process 514 returns to process action 504 to compute the similarity degree of the current set of candidates. Some of the candidates in the current set may be the candidates from previous iterations. In one embodiment, the computing, pruning, and inserting steps are repeated many times to provide accurate similarity calculations and generate candidates with greater similarity.

In process 512, there is a number of methods that can be used for pruning candidates. In some embodiments, a threshold parameter is set. If a candidate does not meet the absolute similarity threshold, it is pruned. In another embodiment, a relative similarity threshold is used for pruning criteria. In another embodiment, the evaluation will test just one candidate from a cluster. If the similarity is high, the entire cluster can be kept. However, if the similarity is low, the entire cluster can be pruned. In process action 514, it uses the knowledge (i.e., similarity calculations) gained from process action 504 to guide the insertion of the derived candidates which are likely to be more similar. Multiple iterations of repeatedly modifying the non-similar portions of a candidate lead to convergence of process with increasingly similar candidates.

Figure 6:
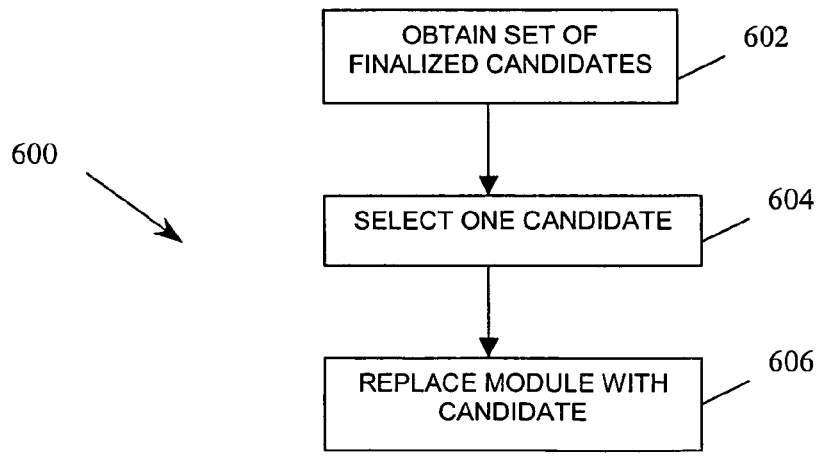
FIG. 6 is a representation of process 600, the candidate selection and replacement process.

An embodiment of process 600, the selection and replacement process, is shown in FIG. 6. The finalized set of evaluated candidates is obtained in process action 602. One of the candidates with the highest similarity degree is chosen in process action 604. The percentage of the potential equivalence points as well as other factors such as the distribution of potential equivalence points can be used as the criteria to evaluate the similarity degree. In process action 606, the selected candidate is used to replace the subcircuit of the component in the golden circuit, the other candidates are disconnected from the netlist. Equivalence checking is performed on the golden and revised circuit.

SYSTEM ARCHITECTURE OVERVIEW

Figure 7:
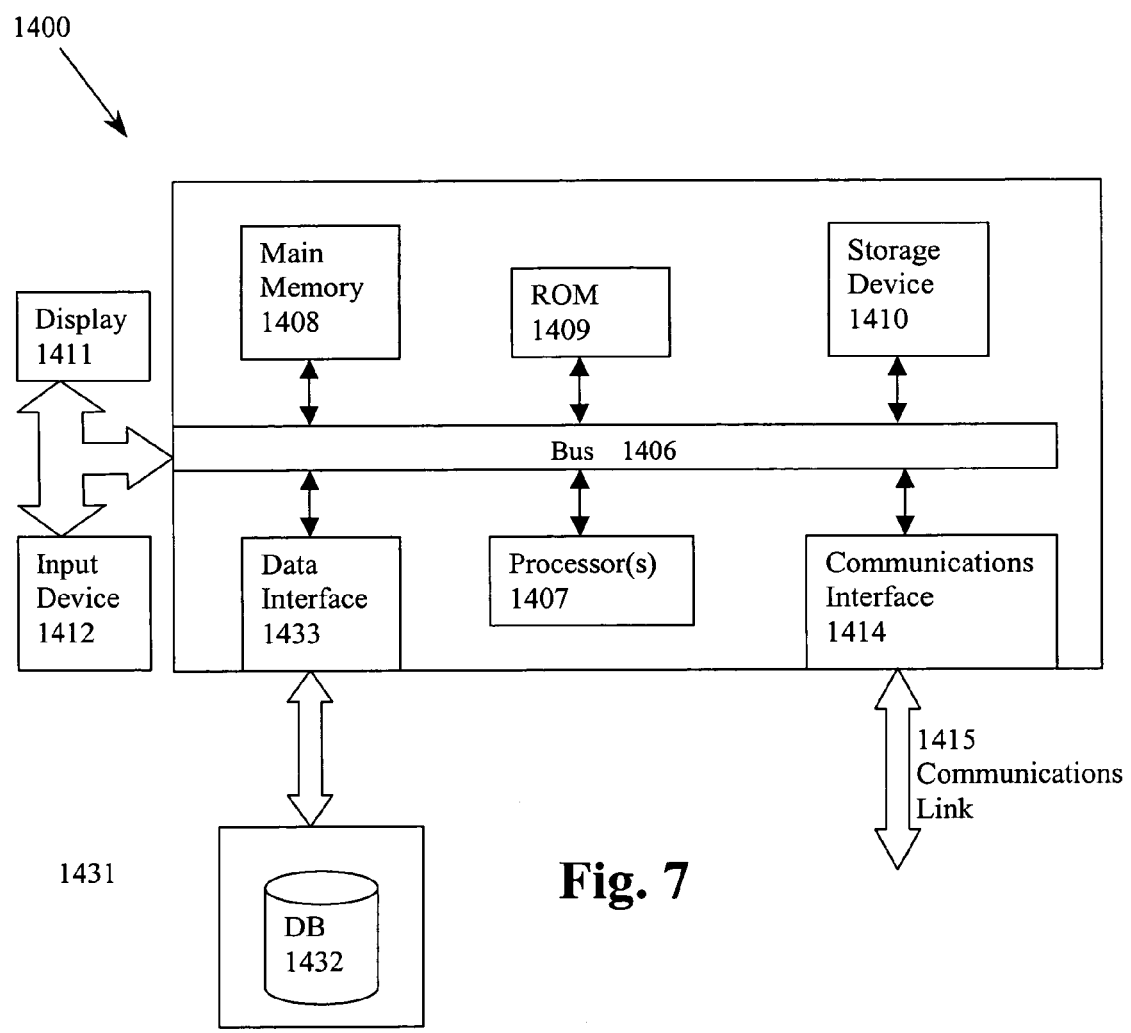
FIG. 7 is a representation of system 1400, a system where subcircuit selection and replacement can occur.

The execution of the sequences of instructions required to practice the embodiments may be performed by a computer system 1400 as shown in FIG. 7. In an embodiment, execution of the sequences of instructions required to enact the embodiments is performed by a single computer system 1400. According to other embodiments, two or more computer systems 1400 coupled by a communication link 1415 may perform the sequence of instructions in coordination with one another. A description of only one computer system 1400 is presented below; however, it should be understood that any number of computer systems 1400 may be employed to enact the embodiments.

A computer system 1400 according to an embodiment will now be described with reference to FIG. 7, which is a block diagram of the functional components of a computer system 1400. As used herein, the term computer system 1400 is broadly used to describe any computing device that can store and independently run one or more programs.

Each computer system 1400 may include a communication interface 1414 coupled to the bus 1406. The communication interface 1414 provides two-way communication between computer systems 1400. The communication interface 1414 of a respective computer system 1400 transmits and receives electrical, electromagnetic or optical signals, that include data streams representing various types of signal information, e.g., instructions, messages and data. A communication link 1415 links one computer system 1400 with another computer system 1400. For example, the communication link 1415 may be a LAN, in which case the communication interface 1414 may be a LAN card, or the communication link 1415 may be a PSTN, in which case the communication interface 1414 may be an integrated services digital network (ISDN) card or a modem, or the communication link 1415 may be the Internet, in which case the communications interface 1414 may be a analog, digital or wireless modem, or a network or Ethernet card.

A computer system 1400 may transmit and receive messages, data, and instructions, including program, i.e., application, code, through its respective communication link 1415 and communication interface 1414. Received program code may be executed by the respective processor(s) 1407 as it is received, and/or stored in the storage device 1410, or other associated non-volatile media, for later execution.

In an embodiment, the computer system 1400 operates in conjunction with a data storage system 1431, e.g., a data storage system 1431 that contains a database 1432 that is readily accessible by the computer system 1400. The computer system 1400 communicates with the data storage system 1431 through a data interface 1433. A data interface 1433, which is coupled to the bus 1406, transmits and receives electrical, electromagnetic or optical signals, that include data streams representing various types of signal information, e.g., instructions, messages and data. In embodiments, the functions of the data interface 1433 may be performed by the communication interface 1414.

Computer system 1400 includes a bus 1406 or other communication mechanism for communicating instructions, messages and data, collectively, information, and one or more processors 1407 coupled with the bus 1406 for processing information. Computer system 1400 also includes a main memory 1408, such as a random access memory (RAM) or other dynamic storage device, coupled to the bus 1406 for storing dynamic data and instructions to be executed by the processor(s) 1407. The main memory 1408 also may be used for storing temporary data, i.e., variables, or other intermediate information during execution of instructions by the processor(s) 1407.

The computer system 1400 may further include a read only memory (ROM) 1409 or other static storage device coupled to the bus 1406 for storing static data and instructions for the processor(s) 1407. A storage device 1410, such as a magnetic disk or optical disk, may also be provided and coupled to the bus 1406 for storing data and instructions for the processor(s) 1407.

A computer system 1400 may be coupled via the bus 1406 to a display device 1411, such as, but not limited to, a cathode ray tube (CRT), for displaying information to a user. An input device 1412, e.g., alphanumeric and other keys, is coupled to the bus 1406 for communicating information and command selections to the processor(s) 1407.

According to one embodiment, an individual computer system 1400 performs specific operations by their respective processor(s) 1407 executing one or more sequences of one or more instructions contained in the main memory 1408. Such instructions may be read into the main memory 1408 from another computer-usable medium, such as the ROM 1409 or the storage device 1410. Execution of the sequences of instructions contained in the main memory 1408 causes the processor(s) 1407 to perform the processes described herein. In alternative embodiments, hard-wired circuitry may be used in place of or in combination with software instructions to implement the invention. Thus, embodiments are not limited to any specific combination of hardware circuitry and/or software.

The term "computer-usable medium," as used herein, refers to any medium that provides information or is usable by the processor(s) 1407. Such a medium may take many forms, including, but not limited to, non-volatile, volatile and transmission media. Non-volatile media, i.e., media that can retain information in the absence of power, includes the ROM 1409, CD ROM, magnetic tape, and magnetic discs. Volatile media, i.e., media that can not retain information in the absence of power, includes the main memory 1408. Transmission media includes coaxial cables, copper wire and fiber optics, including the wires that comprise the bus 1406. Transmission media can also take the form of carrier waves; i.e., electromagnetic waves that can be modulated, as in frequency, amplitude or phase, to transmit information signals. Additionally, transmission media can take the form of acoustic or light waves, such as those generated during radio wave and infrared data communications.

In the foregoing specification, the embodiments have been described with reference to specific elements thereof. It will, however, be evident that various modifications and changes may be made thereto without departing from the broader spirit and scope. For example, the reader is to understand that the specific ordering and combination of process actions shown in the process flow diagrams described herein is merely illustrative, and the invention can be performed using different or additional process actions, or a different combination or ordering of process actions. The specification and drawings are, accordingly, to be regarded in an illustrative rather than restrictive sense.

We claim:

1. A method of subcircuit replacement comprising:
   reading a golden netlist, the golden netlist containing at least one datapath subcircuit;
   reading a revised netlist, the revised netlist being compared against the golden netlist;
   obtaining a set of candidate architectures for each datapath subcircuit;

evaluating each of the set of candidate architectures, wherein the evaluating comprises:
  computing a similarity degree for the candidate architectures in relation to the revised netlist; and
  pruning one or more candidate architectures from the set;
inserting one or more derived candidate architectures into the set of candidate architectures;
selecting one of the candidate architectures; and
replacing datapath subcircuit in the golden netlist with the selected candidate architecture.

2. The method of claim 1 further comprising:
performing equivalence checking on the golden and revised netlists.

3. The method of claim 1, wherein the obtaining the set of candidate architectures comprises:
creating a set of static templates or dynamic templates.

4. The method of claim 3, wherein the static templates are from various pre-defined algorithms to generate the datapath component, wherein one of the pre-defined algorithms can be in bit-level or word-level.

5. The method of claim 3, wherein the creating the dynamic templates comprises:
determining boundaries;
invoking learning; and
creating one or more dynamic templates.

6. The method of claim 5, wherein the creating the dynamic templates further comprises verifying the created dynamic template.

7. The method of claim 1 wherein the inserting the one or more derived candidate architectures comprises:
identifying a portion of a candidate architecture which is not similar to a revised architecture;
reorganizing the identified portion of the candidate architecture to generate a modified candidate architecture, the modified candidate architecture possessing identical functionality as the original candidate architecture; and
inserting the derived candidate architecture into the set of candidate architectures.

8. The method of claim 1, further comprising repeating the computing, pruning, and inserting the derived candidate architectures in a predetermined number of iterations.

9. The method of claim 1, further comprising repeating the computing, pruning, and inserting the derived candidate architectures until a threshold of similarity degree is achieved.

10. The method of claim 1, wherein the pruning one or more candidate architectures comprises:
checking the computed similarity degree for the candidate architectures against a threshold value; and
pruning the candidate architectures if the computed similarity degree does not meet the threshold value.

11. The method of claim 1, wherein the pruning one or more candidate architectures comprises:
checking a first candidate's computed similarity degree against a second candidate's computed similarity degree; and
pruning a candidate architecture with the lower computed similarity degree.

12. The method of claim 1 wherein the computing the similarity degree comprises:
computing the similarity degree for one candidate architecture in a cluster in the set of architectures; and
pruning the cluster based on the computed similarity degree of the one candidate architecture.

13. The method of claim 1, wherein the selecting one of the candidate architectures comprises selecting the candidate architecture with the greatest computed similarity degree.

14. The method of claim 13, wherein the computing the similarity degree comprises computing a percentage of potential equivalence points.

15. The method of claim 14, wherein the computing the similarity degree further comprises computing a distribution of potential equivalence points, wherein the distribution is computed by normalization of distances among the potential equivalence points.

16. The method of claim 15 wherein, the computing a distribution of potential equivalence points comprises determining a relative location distance of the potential equivalence points within the candidate architecture.

17. The method of claim 14, wherein one or more of the potential equivalence points are weighted more heavily than others, the one or more weighted potential equivalence points comprising cutpoints.

18. The method of claim 17, wherein the computing the similarity degree further comprises analyzing circuit structural similarity based on the cutpoints.

19. The method of claim 14, wherein the computing a percentage of potential equivalence points comprises:
connecting a plurality of candidate architectures into the golden netlist based on inputs of the subcircuit;
applying simulations to the entire golden and revised circuits;
identifying one or more wires in one candidate architecture that repeatedly has the equivalence or inverted-equivalence result as one or more wires in the revised netlist in each simulation run, each wire comprising a potential equivalence point; and
calculating the percentage of potential equivalence points over all the wires in the candidate architecture.

20. The method of claim 19, wherein the calculating the potential equivalence points does not need to locate a boundary of the candidate architecture in the revised netlist.

21. The method of claim 1, wherein the replacing datapath subcircuit in the golden netlist with the selected candidate architecture comprises:
retaining the selected candidate architecture as the subcircuit in the golden netlist; and
disconnecting a set of non-selected candidate architectures from the golden netlist.

22. A system for efficient equivalence checking comprising:
a golden netlist, the golden netlist including at least one datapath module;
a revised netlist; and
an equivalence checking module, the equivalence checking module comprising;
  a datapath candidate creation module;
  a datapath candidate evaluation module;
  a datapath candidate modification module;
  a datapath candidate selection and replacement module; and
  an equivalency checking module.

23. The system of claim 22, wherein the revised netlist is a gate-level representation of the golden netlist.

24. The system of claim 22, wherein the candidate creation module having the capability of creation of static and dynamic templates, wherein the static templates are generated from pre-defined algorithms, while the dynamic templates need to determine boundaries of subcircuits in the golden and revised netlists and invoke learning.

25. The system of claim 24, wherein the dynamic templates are verified and become candidates.

26. The system of claim 22, wherein the datapath candidate evaluation module computes the similarity of the datapath candidates.

27. The system of claim 22, wherein the datapath candidate evaluation module performs a simulation on a datapath candidate and the revised netlist, the simulation identifying wires in the golden and revised netlists that have similar results.

28. The system of claim 22, wherein the datapath candidate modification module identifies a portion of the datapath candidates which is not similar to the revised netlist, reorganizes the identified portion while maintaining the same functionality as an original datapath candidate, and adds the modified datapath candidate to the set of datapath candidates.

29. The system of claim 28, wherein multiple modified datapath candidates are created from the same original datapath candidate, the multiple datapath candidates comprising a cluster.

30. A computer program product embodied on computer readable medium, the computer readable medium having stored thereon a sequence of instructions which, when executed by a processor, causes the processor to execute a method for module replacement, the method comprising:
    reading a golden netlist, the golden netlist containing at least one datapath subcircuit;
    reading a revised netlist, the revised netlist being compared against the golden netlist;
    obtaining a set of candidate architectures for each datapath subcircuit;
    evaluating each of the set of candidate architectures, wherein the evaluating comprises:
        computing a similarity degree for the candidate architectures in relation to the revised netlist; and
        pruning one or more candidate architectures from the set;
    inserting one or more derived candidate architectures into the set of candidate architectures;
    selecting one of the candidate architectures; and
    replacing datapath subcircuit in the golden netlist with the selected candidate architecture.

31. The product of claim 30, wherein the obtaining a set of candidate architectures comprises:
    creating a set of static templates or dynamic templates, wherein the creating the dynamic templates comprises:
    determining boundaries;
    invoking learning; and
    creating one or more dynamic templates.

32. A method for evaluating a subcircuit of a golden netlist comprising:
    identifying a candidate from a set of candidates that meets a first similarity degree threshold;
    isolating a non-similar portion of the identified candidate; and
    reorganizing the non-similar portion to create one or more derived candidates, the one or more derived candidates having the same functionality as the identified candidate.

33. The method of claim 32, further comprising:
    inserting the one or more derived candidates into the set of candidates;
    repeating the identifying, isolating, reorganizing, and inserting until a second similarity degree threshold is reached;
    selecting one of the set of candidates; and
    replacing the subcircuit with the selected candidate.

* * * * *